United States Patent [19]
Collins et al.

[11] Patent Number: 5,276,584
[45] Date of Patent: Jan. 4, 1994

[54] ELECTRONIC UNIT

[75] Inventors: Hugh M. Collins, Nepean; Hasler R. Hayes, Munster Hamlet; John S. Moss, Ottawa; Clifford D. Read, Stittsville; Tristano F. Nicoletta, Nepean; John B. Drayton, Nepean; David J. Pell, Nepean; Roman Katchmar, Ottawa, all of Canada

[73] Assignee: Northern Telecom Limited, Montreal, Canada

[21] Appl. No.: 42,205

[22] Filed: Apr. 2, 1993

Related U.S. Application Data

[62] Division of Ser. No. 786,232, Oct. 31, 1991, Pat. No. 5,218,516.

[51] Int. Cl.$^5$ .................................................. H05K 7/20
[52] U.S. Cl. ................................ 361/718; 165/80.3; 165/185; 174/16.3; 257/722; 361/690; 361/709; 361/702
[58] Field of Search ............... 165/80.2, 80.3, 185; 174/16.3; 361/382, 383, 385-389, 386-389; 257/706, 709, 712, 713, 722

[56] References Cited

U.S. PATENT DOCUMENTS

| | | | |
|---|---|---|---|
| 3,011,105 | 11/1961 | Blanc | 174/16.3 |
| 3,299,946 | 1/1967 | Recklinghausen | 361/383 |
| 3,305,004 | 2/1967 | Barlowe | 165/80.3 |
| 4,918,571 | 4/1990 | Grabbe | 361/388 |

*Primary Examiner*—Gregory D. Thompson
*Attorney, Agent, or Firm*—R. J. Austin

[57] ABSTRACT

Electronic unit of printed circuit board with electronic components on one side and its other side in heat conducting contact with a heat sink enables the electronic components to be sealed from ambient atmosphere and thus unpackaged chips may be used. The units are mountable in a support frame with air cooling passages of the heat sinks extending vertically for convected cooling air. In each unit, a resistor network may extend into a cavity formed in a heat exchange rib and an electronic chip, perhaps unpackaged in the sealed environment, may be in heat conductive relationship with the heat sink.

1 Claim, 6 Drawing Sheets

ELECTRONIC UNIT

This application is a division of U.S. Ser. No. 07/786,232 filed Oct. 31, 1991, now U.S. Pat. No. 5,218,516.

This invention relates to electronic units.

In the telecommunications industry, it is conventional practice to incorporate in telecommunications systems printed circuit boards which are individually mounted as edge cards in a frame structure into which the edge cards are individually insertable and are connectable by connectors at their rear edges into terminals in a backplane. For instance, edge cards may be used in switching or transmission systems, in the latter of which they may be used as receiver transmission modules.

There are various problems with the above conventional arrangement. One problem concerns the removal of heat generated in use by electronic components which extend outwardly from surfaces of the edge cards. The heat generated, if not removed, is sufficient in many cases to cause premature failure of components thereby resulting in a high percentage of transmission or switching failures or malfunctions. Such a high failure rate would be extremely costly in use of equipment and would be highly labor intensive for maintenance purposes.

To combat the above problem, edge cards are mounted in side-by-side vertical planes and cooling air is driven upwardly between the cards by fans situated below groups of edge cards. While hot spots may develop in surface areas of cards which may detract from the life expectancy of certain electronic components, on the whole, cooling efforts have been successful. However, the components are in contact with ambient atmosphere and are subject to humidity problems. In addition, dust and other foreign particles are driven upwardly by the fan and are deposited upon edge card and electronic components mounted thereon so to detract from the electronic performance. This deposition also provides thermally insulating layers which lessen the rate of heat removal thus causing an undesirable increase in temperature of the components. Because of the deleterious effects of dust and other foreign particles, electronic chips are conventionally packaged so as to seal them. Packaging is expensive and may provide an undesirable heat insulating function for a chip which, unless adequately cooled, tends to increase in temperature at a rapid rate with possible drastic results in performance.

The present invention seeks to provide a electronic unit construction which will alleviate or lessen the above problems.

According to one aspect of the invention there is provided an electronic unit comprising a printed circuit board and a heat sink means, the printed circuit board having one side surface with electronic components extending outwardly therefrom, the printed circuit board assembled with its other side surface in heat conducting relationship with a surface of the heat sink means, the heat sink means also having heat release projection means exposed for contact by a flow of cooling fluid across the heat release projection means, the unit also including a cover means covering the electronic components.

An electronic component in the electronic unit of the invention may for instance comprise a packaged or unpackaged chip resistor or capacitor or other individual electronic components manufactured for assembly onto a printed circuit board or for use as part of a ceramic resistor or hybrid.

The invention additionally includes an electronic unit comprising a heat sink means having two side surfaces, a printed circuit board means having two printed circuit board regions each of which is an electronic component bearing region having one side surface with electronic components extending outwardly therefrom, the bearing regions having their other side surfaces in heat conductive relationship, one with each of the two side surfaces of the heat sink means, the heat sink means also having a heat release projection means exposed for contact by flow of cooling fluid across the heat exchange projections, the unit also including a cover means covering the electronic components.

In the above electronic units according to the invention, the cover means restricts the air flow across the electronic components and thus minimizes the presence of dust and other foreign particles upon the components. In a preferred arrangement the cover means defines a chamber means which houses the electronic components and the chamber means is sealed from ambient atmosphere. This is easily achieved by the cover means sealing directly either against the heat sink means or against the one side surface of the electronic component bearing regions of the printed circuit board means. In the sealed arrangement, the chamber means is completely separated from the ambient atmosphere and also from the air flow so that no dust or other foreign particles may enter the chamber means to contact the electronic components to deleteriously affect electronic performance. In addition, because the electronic component bearing regions of the printed circuit board are in heat conducting relationship with the heat sink means, then thermal management may be achieved in which heat generated by the electrical components is extracted through the printed circuit board and into the heat sink means to be removed by air flow on the other side of the heat sink means. The heat conducting relationship may be achieved by direct and substantially intimate surface contact between the printed circuit board means and the heat sink means or alternatively by the presence of thermal grease or thermal polymer between the printed circuit board means and the heat sink means.

It follows that with packaged or unpackaged chips and other electronic components, the needs of the components are addressed, these needs including maintenance of cleanliness of components and efficient heat removal.

It is envisaged that with the above electronic units according to the invention arranged so that the heat release projection means define upwardly extending passages between them, then an upward flow of cooling fluid, e.g. air, results and this flow may be created by natural convection as the air within the passages becomes heated. As a result, in certain designs, it may be possible to rely solely upon convection of cooling fluid, preferably air, between the heat release projection means, but it is also envisaged that in certain applications, fans may still be used as required for driving the cooling air between the heat release projection means. However, as may be seen, with or without the use of the fans, the cooling air passes between the projection means and it is impossible for the air to contact the electronic components directly.

In a preferred arrangement of an electronic unit having two side surfaces, the heat sink means comprises two walls which are spaced apart to define passage means for the flow of cooling fluid, with the side surfaces facing in opposite directions on the outside of the walls. In this type of construction, the projection means preferably comprises spaced apart ribs with the passage means disposed between the ribs. These ribs extend from each wall and are preferably rectilinear so as to extend upwardly in a certain position of use of the electronic unit and with the ribs lying mutually in substantial parallel relationship. The arrangement may be such that free ends of the ribs of one wall oppose the free ends of corresponding ribs of the other wall and these free ends may even contact each other. Alternatively, the heat sink means may be formed as an integral structure with the ribs extending completely from one wall to the other to define the passage means.

With the structure according to the invention it is also possible to provide a rib as part of the projection means and in which the rib is provided with a cavity which terminates in a position spaced from each end of the rib. A corresponding electronic component bearing region of the board means has in this arrangement, a resistor which extends into the cavity with sides of the cavity sufficiently close to the resistor that heat exchange occurs across the gap from the resistor to the rib.

With the electronic unit having two walls according to the invention, the two walls may be connected at one or each end with an end surface and the printed circuit board means may further comprise a connector mounting region carried upon the one end surface and electrically connected with each of the electronic component bearing regions. Alternatively, or in addition, the other end surface carries an additional region of the printed circuit board, this additional region also being electrically connected with each of the electronic component bearing regions. In this arrangement, the additional region may have a surface remote from the heat sink means and which supports electronic components extending outwardly therefrom and the cover means extends around the heat sink means to cover the electronic components on this additional region.

The invention further includes a support frame and electronic unit combination comprising a plurality of electronic units each of which comprises a printed circuit board and a heat sink means, the printed circuit board having one side surface with electronic components extending outwardly therefrom, the printed circuit board assembled with its other side surface in heat conducting relationship with a surface of the heat sink means, the heat sink means also having a heat release projection means exposed for contact by a flow of cooling fluid across the heat release projection means, each unit also including a cover means covering the electronic components; and a support frame comprising a plurality of adjacent receiving stations for reception and removal of the electronic units, with the heat release projection means of each unit, when within its station, defining upwardly extending passage means, the support frame also having means to permit a flow of cooling gas to pass into, upwardly through, and out from the passage means.

The invention further includes a support frame and electronic unit combination comprising a plurality of electronic units each of which comprises a heat sink means comprising two side surfaces, printed circuit board means having two printed circuit board regions each of which is an electronic component bearing region having one side surface with electronic components extending outwardly therefrom, the bearing regions having their other side surfaces in heat conducting relationship, one with each of the two side surfaces of the heat sink means, the heat sink means also having a heat release projection means exposed for contact by a flow of cooling fluid across the heat exchange projections, the unit also including a cover means covering the electronic component; and a support frame comprising a plurality of adjacent receiving stations for reception and removal of the electronic units, with the heat release projection means of each unit, when within its station, defining upwardly extending passage means, the support frame also having means to permit a flow of cooling gas to pass into, upwardly through, and out from the passage means.

With the latter support frame and electronic unit combination according to the invention, the receiving stations may be disposed horizontally side-by-side or in addition or alternatively the receiving stations are relatively vertically disposed. With the receiving stations positioned vertically, the electronic components when in position in the receiving stations should have their passage means interconnecting for upward flow of cooling gas. In addition, with the latter combination according to the invention, it is possible for the heat sink means to have an end surface extend between the two side surfaces and the connecting mounting region of the printed circuit board is carried upon the end surface and is electrically connected with each of the electronic component bearing regions. In this arrangement, with each electronic unit received into its receiving station by moving it rearwardly from a front towards the rear of the frame, the end surface of the heat sink means and the connecting mounting region face forwardly from the front of the frame for frontal access to connectorize the printed circuit board means. This arrangement of combination of frame and electronic units provides an arrangement in which the connectorization and access for removal and insertion of the units may be performed completely from the front of the frame. With such an arrangement therefore the use of a backplane as with normal edge card technology is completely dispensed with.

In conventional edge card constructions, apart from the heat generated by electrical components causing failure problems therewith, it is additionally known that electronic chips tend to generate heat at a faster rate than other components and have their own specific temperature problems which need to be overcome by cooling air. The present invention also seeks to provide an electronic unit which will alleviate or overcome this particular problem.

Accordingly, the present invention also includes an electronic unit comprising a printed circuit board and a heat sink means, the printed circuit board assembled to a surface of the heat sink means with one side surface of the board facing outwardly from the heat sink means and the other side surface in heat conducting relationship with the surface of the heat sink means, the unit also comprising an electronic chip disposed in heat conductive relationship with the heat sink means, the arrangement being such that heat passing from the chip to the heat sink means bypasses the board.

With this arrangement according to this particular aspect of the invention, rate of heat transfer from the chip to the heat sink means cannot be lessened by any heat conducting peculiarities of the board. In contrast, heat from the chip is taken directly into the heat sink means and thus is emitted into any cooling fluid contacting the heat sink means.

The invention also includes an electronic unit comprising a printed circuit board and a heat sink means, the printed circuit board assembled to a surface of the heat sink means which also has a heat release projection means exposed for contact by a flow of cooling fluid across the heat release projection means, the projection means including at least one rib formed with a cavity which opens on the surface of the heat sink means and terminates in a position spaced from each end of the rib, and the printed circuit board has a resistor network extending outwardly from the board and into the cavity with sides of the cavity sufficiently close to the resistor network that heat exchange occurs across the gap from the resistor network and into the rib.

With the above structure according to the invention, the resistor network is enclosed within the cavity which is closed at its ends, and cooling fluid is directed across the projection means so as not to contact the network whereby heat is successfully extracted from it while not permitting it to become deleteriously coated with particles carried by the cooling fluid.

In addition, the present invention includes an electronic unit comprising a printed circuit board means comprising two printed circuit boards which are spaced-apart and which have circuitries electrically connected together by electrical conductors carried by an interconnecting board region which is disposed between two electrically conductive surface means connectable to ground and spaced from the electrical conductors in the interconnecting board region to a capacitative effect and EMI filter for the printed circuit board means and also to provide an EMI shield between the one printed circuit board and the other.

Embodiments of the invention will now be described, by way of example, with reference to the accompanying drawings, in which.

Figure 1:
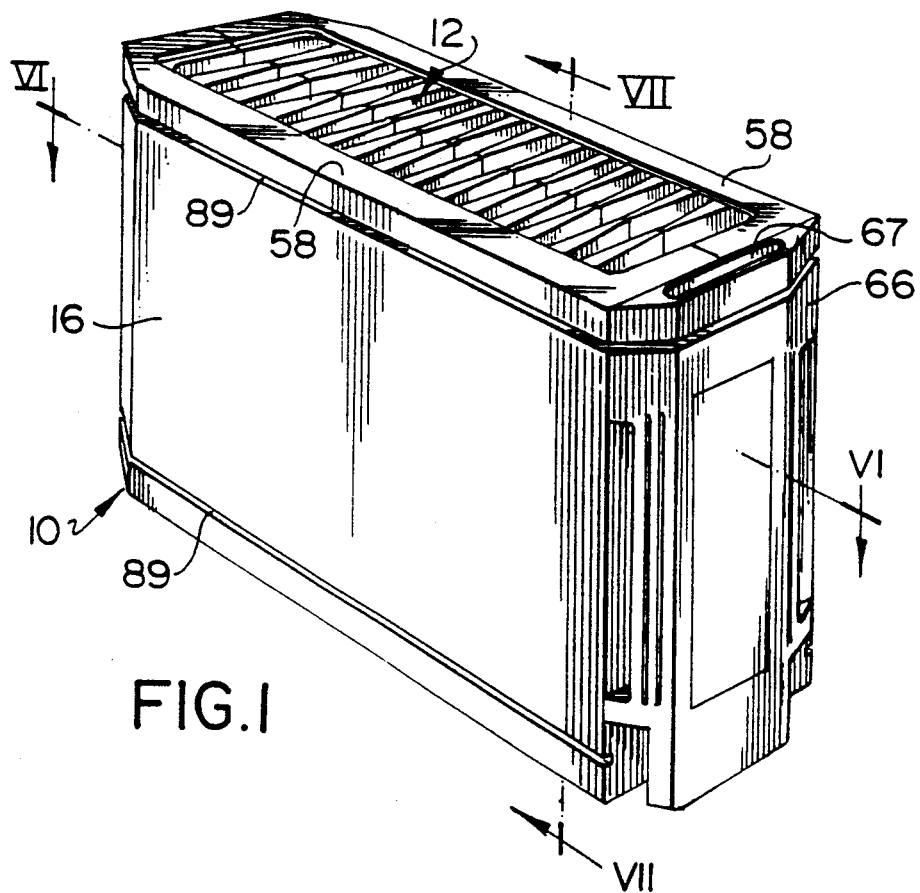
FIG. 1 is an isometric view of an electronic unit according to a first embodiment.
Figure 5:
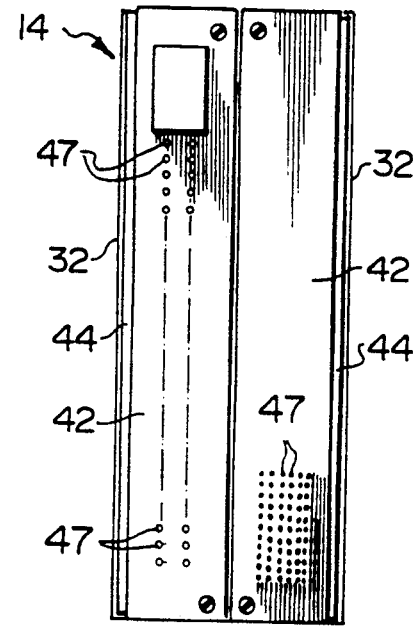
FIGS. 4 and 5 are end views of the unit of the first embodiment taken, respectively, in the direction of arrows IV and IV in FIG. 3.

In a first embodiment, as shown by FIG. 1, an electronic unit 10, to be used as a single module in conjunction with other modules in a support frame and unit combination, comprises a heat sink means 12, a printed circuit board means 14 (FIGS. 2 and 5 for example) and a cover means 16.

Figure 2:
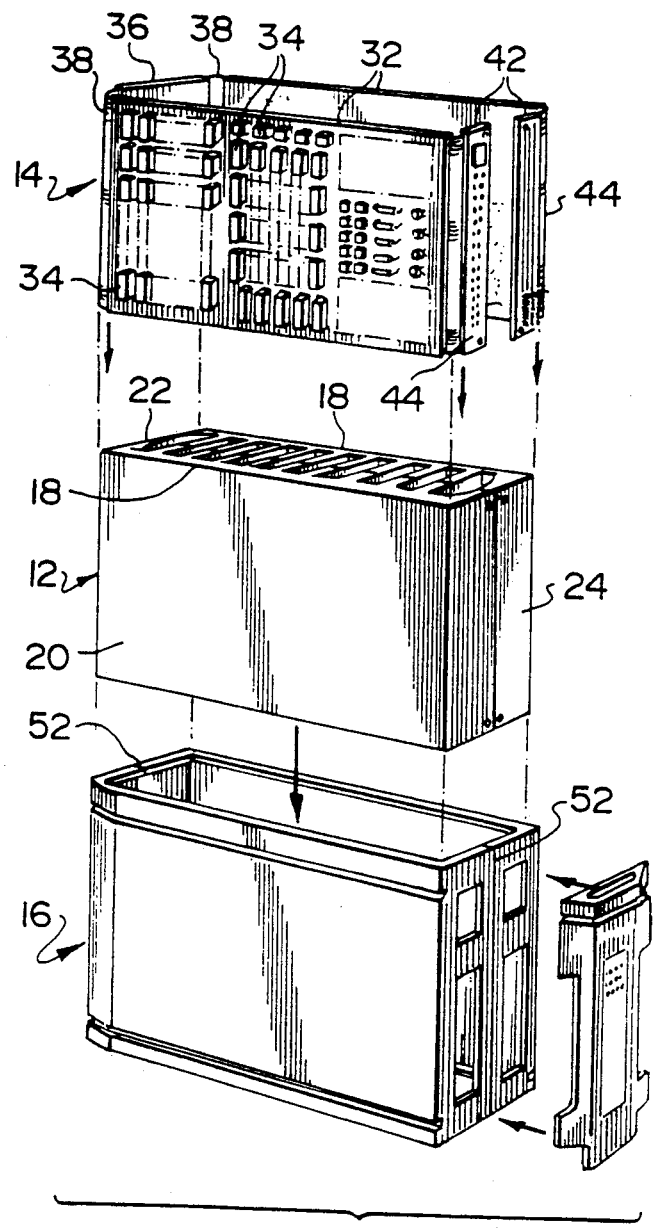
FIG. 2 is an exploded isometric view from the same position as FIG. 1, but to a smaller scale, of the electronic unit of FIG. 1.
Figure 6:
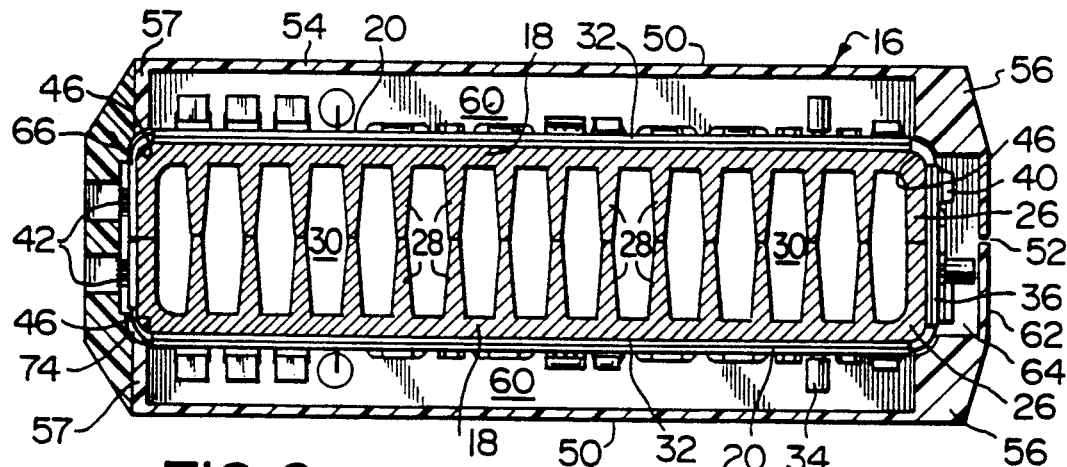
FIGS. 6 and 7 are respectively, horizontal and vertical cross-sectional views through the electronic unit of the first embodiment taken along lines VI—VI and VII—VII in FIG. 1.

As is more clearly shown in FIGS. 2 and 6, the heat sink means comprises two parallel spaced-apart side walls 18 with two outwardly facing side surfaces 20 directed in opposite directions from the walls 18. Surfaces 20 are interconnected at their two ends by two end surfaces provided upon end walls 22 and 24. As shown by FIG. 6, the end walls and the side walls lie at substantially 90° to each other so as to substantially form a parallelogram outer shape. The heat sink means 12 is formed of two separate heat sink structures 26 (FIG. 6), each of the structures 26 comprising one of the walls 18 and half of each of the end walls 22 and 24 so that in the assembly of the heat sink 26 the two parts of the end walls substantially contact each other as shown in FIG. 6 in abutting relationship.

Each heat sink is also provided with integral heat release projection means in the form of rectilinear and parallel ribs 28 which extend inwardly of the heat sink means from side walls 18 between end walls 22 and 24. As may be seen from FIG. 6, the ribs 28 extend from the two heat sinks so as to form rib pairs from one heat sink to the other and free ends of the ribs 28 oppose each other and lie substantially in contact. This arrangement provides a passage means for the flow of a cooling fluid, namely air, between the ribs, the passage means being defined by separate passages 30 defined by the substantially contacting pairs of ribs. In an alternative construction (not shown) the heat sink means is formed as an integral structure with the ribs extending from one wall 18 completely across to the other.

Figure 4:
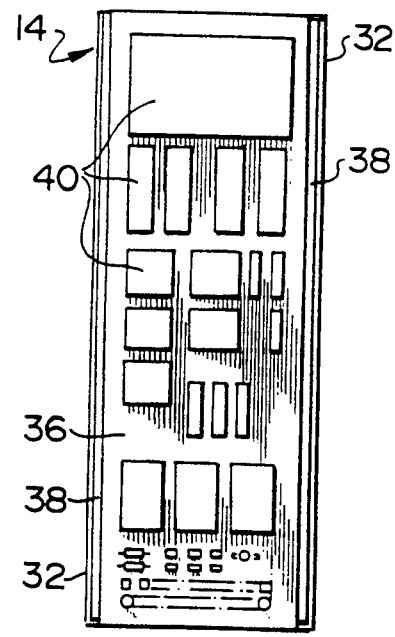

The printed circuit board means is constructed as will now be described, to substantially surround the heat sink means by extending around the end walls and the side walls. The printed circuit board means is an integral structure (FIG. 2) comprising two printed circuit board regions 32 with electronic components 34 extending from one face of end region 32, the electronic components 34 being of any desired type and being in any desired position to suit the circuitry requirements of the printed circuit board. Two printed circuit board regions 32 are integrally connected together by an additional circuit board region 36 which is small in facial area compared to the regions 32 so as to cover one of the wall 24. The printed circuit board region 36 is connected at each side with a specific region 32 by a narrow flexible connecting board region 38 which carries electrical conductors either upon one of its surfaces or embedded within the region 38 for interconnecting circuitry of the two printed circuit board regions 32. As may be seen particularly from FIGS. 4 and 6, the printed circuit board region 36 also has electronic components 40 extending from an outer side surface of the assembly.

Figure 3:
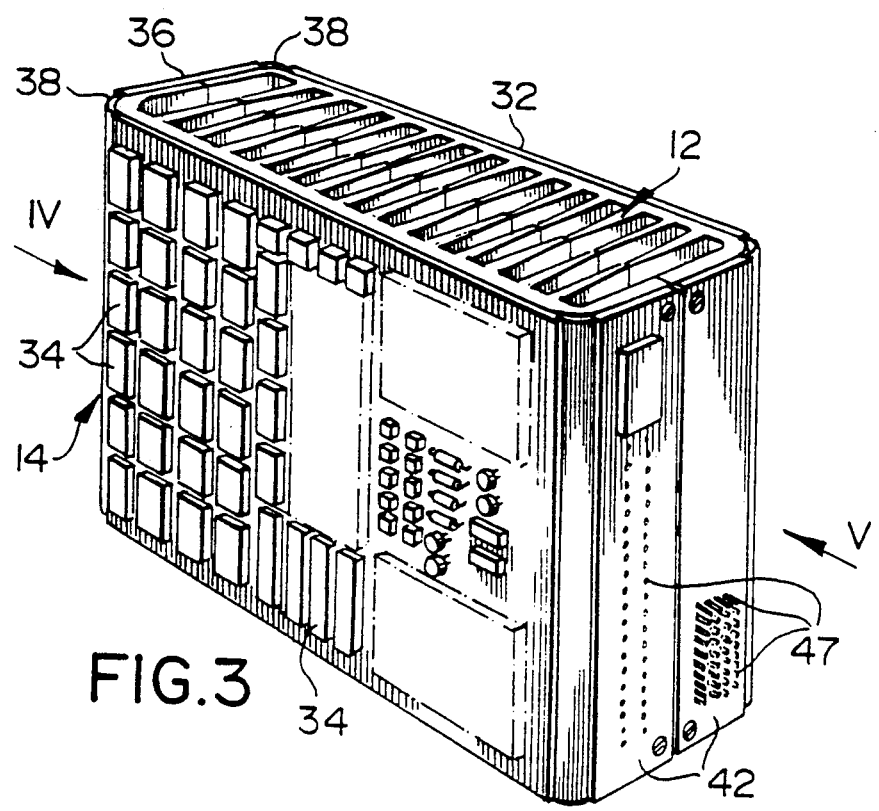
FIG. 3 is an isometric view similar to FIG. 1 of part of the unit of the first embodiment.

At their other ends, the board regions 32 are connected to a connector mounting region of the printed circuit board. The connector mounting region comprises two separate narrow connector board strips 42 connected by flexible interconnecting board regions 44 one to each of the board regions 32. These interconnecting board regions carry electrical conductors for interconnecting terminals 46 of the printed circuit board strips 42 (FIGS. 3 and 5) with circuitry in the board regions 32. As shown by the figures, (particularly FIG. 3), the printed circuit board means 14 is wrapped around the side walls and end walls of the heat sink means with the board regions 32 in heat conducting engagement with the surfaces 20 and with the board region 36 and the connector board strips 42 in heat conducting engagement with the end walls 22 and 24. The heat conducting engagement may be direct or a thermal grease or thermal polymer may be sandwiched between the board regions and the surfaces of the heat sinks. As may be seen from FIGS. 3 and 6, in the assembly, all of the electronic components 34 and 40 face outwardly from the printed circuit board means. To assemble the printed circuit board means onto the heat sink structure, the flexible interconnecting board regions 38 and 44 are flexed into arcuate form around convex end surfaces 46 of the heat sink 26, these convex surfaces 46 merging into the surfaces 20 and the surfaces of the end walls 22 and 24. This is as shown in FIG. 6 and also in greater detail in the enlarged partial view of FIG. 8.

Figure 7:
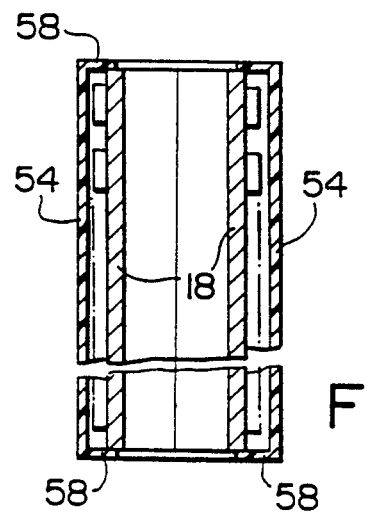

The electronic unit 10 is completed by the cover means 16. As shown by FIGS. 1, 2 and 6, the cover means comprises two half covers 50, each of which extends across a board region 32 and partly around each end wall 22 and 24 so as to cover substantially half of each of the additional region 36 and one of the printed circuit board strips 42. The two half covers 50 are brought together with edges 52 in substantial abutting relationship outwardly of the end walls 22 and 24. As shown by FIG. 6, each half cover 50 is formed with a wall 54, end walls 56 and 57 (FIG. 6) and upper and lower walls 58 (FIG. 7), the walls 56, 57 and 58 provided as flanges extending inwardly from one side of the wall 54. End walls 56 and 57 extend around the ends 22 and 24 to provide the abutting edges 52 of the cover means. The half covers are sealed in position around the structure of printed circuit board and heat sink means with the walls 58 extending in sealing engagement onto ends of the walls 18, 22 and 24 of the heat sinks 26.

With the half covers 50 assembled in position as shown in FIG. 6, the walls 54 are held spaced away from the regions 32 of the printed circuit board to provide chambers 60 which are sealed from the ambient atmosphere and which house the outwardly extending electronic components 34. In addition, each of the walls 56 extends at its outer end regions as a thin wall region 62, the wall regions 62 acting together to define an additional chamber 64 which houses the outwardly extending electronic components on the printed circuit board region 36 so as to seal them from ambient atmosphere. The cover also includes a connector cover portion 66 (FIGS. 1 and 6) mounted at one end of the structure upon the walls 57 to shroud the terminals 46 on the printed circuit board strips 44 and the connectors (not shown) when mounted thereon. One end of the cover portion 66 is also provided with a connector opening 67 for mounting a power and data connector.

Figure 8:
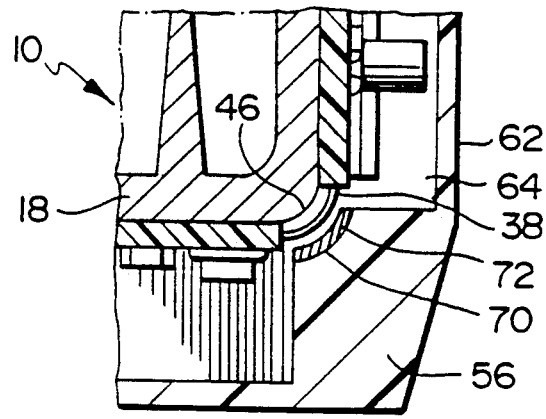
FIG. 8 is a vertical cross-sectional view similar to FIG. 6 of a detail of part of the electronic unit of the first embodiment and to a larger scale.

As mentioned above, each of the flexible interconnecting board regions 38 and 44 of the board are flexed in the assembled condition into an arcuate shape which extends around a convex end surface 46 of the heat sinks 26. In addition, each of the walls 56 is thicker at the corners of the assembly as shown in FIGS. 6 and 8, so as to extend inwardly into close proximity with a corresponding interconnecting board region 38. An inner surface 70 of each of the walls 56 is of concave configuration so as to lie substantially parallel to and oppose the whole of the convex outer facing surface of the corresponding interconnecting board region 38. FIG. 8 shows clearly that a board region 38 extends around the concave surface 46 of a heat sink 26 while lying extremely close to both that surface and to the surface 70 of a wall 56. This closeness is to provide a capacitative and EMI filter effect between the electrical conductors in the interconnecting board region on one hand and the surface 46 of the heat sink and the surface 70 on the other hand. The distances involved are in the order of a few mil, e.g. up to around 45 mil, and are dependent upon the capacitative and EMI filter effect required. The structure also provides an EMI shield between the board regions 32 and 36. For capacitance and EMI filter and shield purposes, the heat sink 26, which is formed from metal is connectable to ground potential when mounted in a support frame structure to be described. For the same purpose, while each of the half covers 50 is suitably molded from a dielectric plastics material, each of the surfaces 70 is provided by a coating of electrically conductive material 72 (FIG. 8) which is also connectable to ground potential upon assembly into a support frame structure.

At the other end of the electronic unit assembly as shown by FIG. 6, required capacitative EMI filter and EMI shield effects are similarly provided between each of the board strips 42 and the heat sinks 26 on the one side and the walls 57 and the connector cover portion 66 on the other side. The cover portion 66 is formed with a convex surface 74 at each side in close association with the board strips 42 to extend the length of the conductive surface facing a strip 42. A conductive coating is present upon the concave surfaces 74 and of the walls 57 similar to that present on the surface 70.

Figure 9:
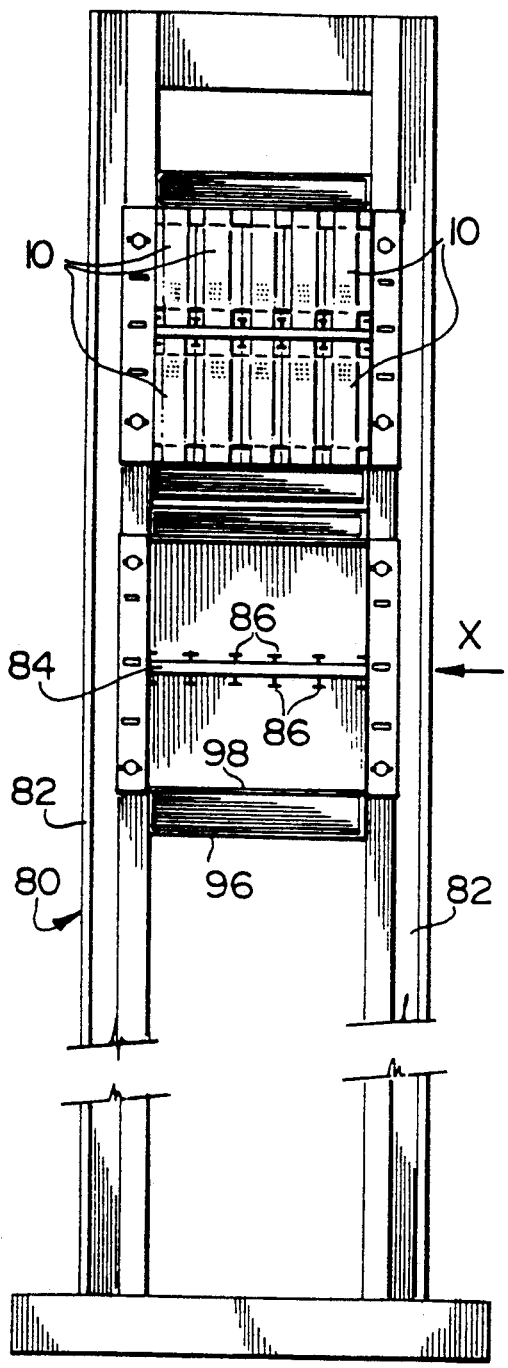
FIG. 9 is a front view of an assembly of electronic units of the first embodiment into a support frame.

The electronic unit 10 described above together with a plurality of similarly constructed units is suitable for assembly into a support frame 80 such as is described with reference to FIGS. 9 and 10. The frame 80 comprises two vertical main support members 82 between which are disposed a plurality of vertically spaced horizontal support platforms 84 having a plurality of parallel rectilinear guiding supports 86 projecting upwardly and downwardly therefrom. The supports 86 are directed from the front 88 (FIG. 10) to a rear 90 of the frame structure. The guiding supports 86 are of T-shape as shown by FIG. 9 with the lower row of supports 86 being of inverted T-shape and directly disposed beneath the upper supports 86. Adjacent supports 86 are for sliding reception within grooves 89 provided towards the top and bottom edges of each of the half covers 50, for instance as shown in FIG. 1, to enable each of the units 10 to be assembled into an individual receiving station in the frame structure 80. As may be seen from the upper end of FIG. 9, five units are disposed in this embodiment in horizontal side-by-side relationship in respective receiving stations in two vertically disposed rows of stations. In the upper stations, the guiding supports 86 are located in lower grooves 88 of the half covers 50 while in the lower stations the electronic units 10 hang downwardly from the lower guiding supports 86 which are received in the upper grooves 88 of the half covers 50. Each support plate 84 is formed with apertures (not shown) which coincide with the passages 30 for upward flow of air upon assembly of the electronic units into the frame.

Figure 10:
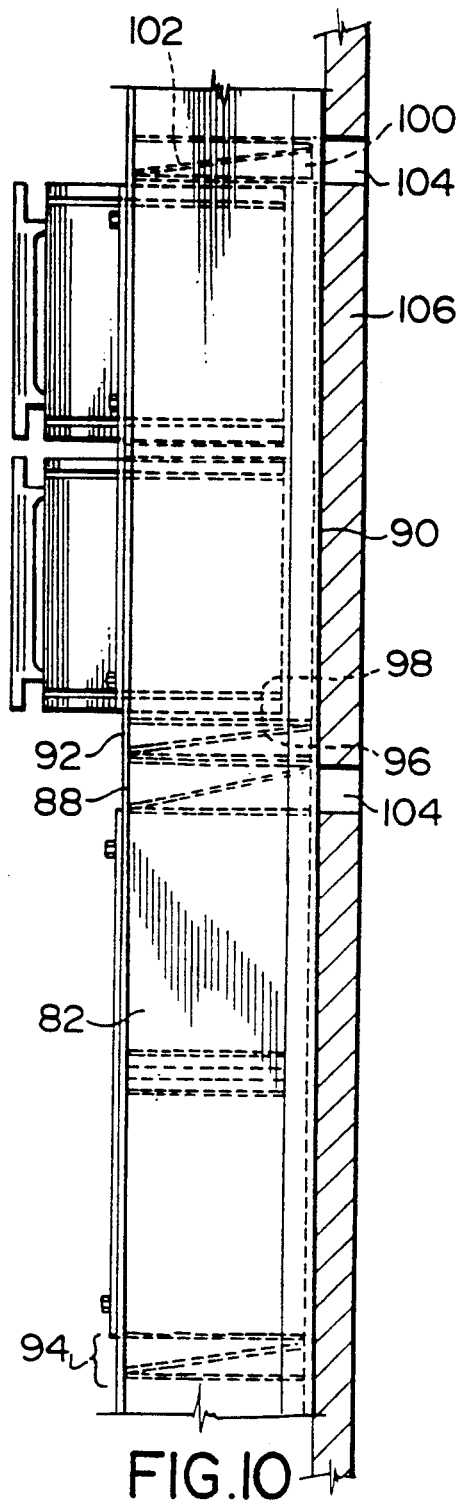
FIG. 10 is a side elevational view of part of the assembly of FIG. 9 in the direction of arrow X in FIG. 9 and to a larger scale.

With the electronic units disposed in their receiving stations as shown at the top part of FIG. 9 and in FIG. 10, the passages 30 for flow of air extend upwardly between the ribs 28 and during use, the heat generated by the electronic components in each of the units 10 is transferred through the printed circuit board and into the heat sink means to be transferred from the ribs 28 into cooling air flowing upwardly through the passages. The design requirements are such that air is moved upwardly naturally by convection as it is warmed in the passages 30 by the heat transfer so that cooling fans are not required. Of course with two or more of the electronic units arranged in vertical alignment in their respective receiving stations as shown in FIGS. 9 and 10, then the convection effect is increased so as to provide better upward flow of air. The air is drawn into the frame structure through entrances 92 provided by box structures 94 having a lower sloping panel 96 and an upper horizontal panel 98 the air moving upwardly through apertures in the upper horizontal panel 98 disposed beneath the lower horizontal row of electronic units. The air exits from an exit passageway 100 having an upper boundary provided by an upper sloping panel 102 (FIG. 10) and passes through an interconnecting aperture 104 in a wall 106 upon which the frame structure 80 is mounted. The distance between the inlet 92 and exit 100 for the air is partly dependent upon the amount of heat transfer which is required and may be positioned, for instance, to accommodate air flow through one, two or more horizontal rows of receiving stations. In FIG. 10, there are two horizontal rows of receiving stations each containing five modules 10 between the inlet 92 and exit 100.

The electronic units 10 having flat sides provided by the walls 54 of the cover means to provide a compact storage arrangement in the support frame structure with the walls 54 lying side-by-side and in close proximity with each other. As may be seen, because of the use of the cover means, particularly in a sealing capacity as described in the embodiment, it is impossible for ambient air to contct the electronic components carried by the printed circuit board means and thus the performance of these components does not deteriorate due to accumulation of dust or foreign particles upon them. In this embodiment, each unit 10 which forms a separate module has approximate overall dimensions of 3.4 inches wide, a height of 7.4 inches and a depth between the walls 56 and cover portion 66 of 8.8 inches, and is thus easily managed manually for insertion and removal purposes and for general handling.

While the electronic components of the first embodiment and according to the invention should preferably be used with convected air, cooling fans may of course be employed if deemed necessary. The cover means of each of the units will, of course, still protect the electronic components of the printed circuit board from the effects of dust or other foreign particles with use.

As described in the above embodiment, the printed circuit board means is constructed with the printed circuit board regions 32 spaced apart by the additional board region 86 and its additional board region 38 and the connector board strips 42 being disposed at the remote edges of the regions 32, the arrangement being such that the printed circuit board means may be wrapped around the heat sink means. In an alternative construction (not shown), the connector mounting region is a single region instead of two strips as the strips 42 in the first embodiment, and is disposed between the board regions 32 in the position described for the board region 38 in the embodiment. In this alternative case, the additional board region is provided as two separate strips disposed along the remote edges of the region 32 in a similar manner to the strips 42 in the first embodiment.

In a further alternative, the printed circuit board means includes two boards each of which comprises a printed circuit board region 32 and a strip at each end, one strip being similar to a printed circuit board strip 42 and the other strip being part of the region 36 of the board.

Figure 11:
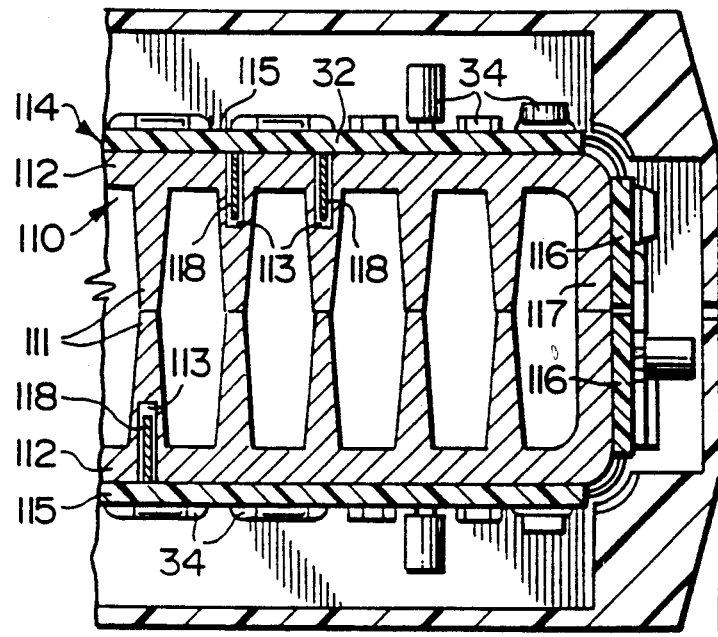
FIG. 11 is a view similar to FIG. 6 of part of an electronic unit according to a second embodiment and to a larger scale than in FIG. 6.

A second embodiment of the invention is shown in FIG. 11 which is a part sectional view similar to that of FIG. 6 in the first embodiment and to a larger scale. The second embodiment is basically of the same structure as the first embodiment and the same reference numerals are used for similar parts.

In the second embodiment, a heat sink means 110 has two separate heat sinks 112 constructed substantially as described for the heat sinks 26 of the first embodiment. However, in this embodiment, certain of the ribs 111 of the heat sinks 112 are formed with longitudinally extending cavities 113 as shown by FIG. 11, these cavities terminating a distance spaced from the ends of the ribs so that a flow of air cannot pass along them. A circuit board means 114 comprises two individual printed circuit boards 115 each of which comprises a printed circuit board region 32 having surface mounted electronic components 34 and a board strip 42 of the connector region disposed at one end of the region 32 and connected to region 32 by a flexible interconnecting strip 44. At the other end of each board region 32 is disposed another board region 116 which extends around the end wall 117 of the heat sink and terminates on the same plane as the free ends of the ribs 111. Edges of the board regions 116 of the two boards lie in close relationship as shown. Each of the board regions 32 has, in addition to the electronic components 34, planar resistor networks 118 which extend from the opposite face of each board region, the planar resistor networks entering into and being housed within the cavities 113 in the ribs 111. Sides of each cavity are sufficiently close to the respective resistor network 118 that heat exchange will occur across the gap from the resistor network and into the corresponding rib 111. Hence, the arrangement of the resistor networks within the cavities 113 provide for heat exchange from the ribs 111 into air passages 30. The resistor networks of course can not be contacted by dust or other foreign particles because they lie within the cavities which are otherwise closed except for the opening for acceptance of the resistor networks.

Figure 12:
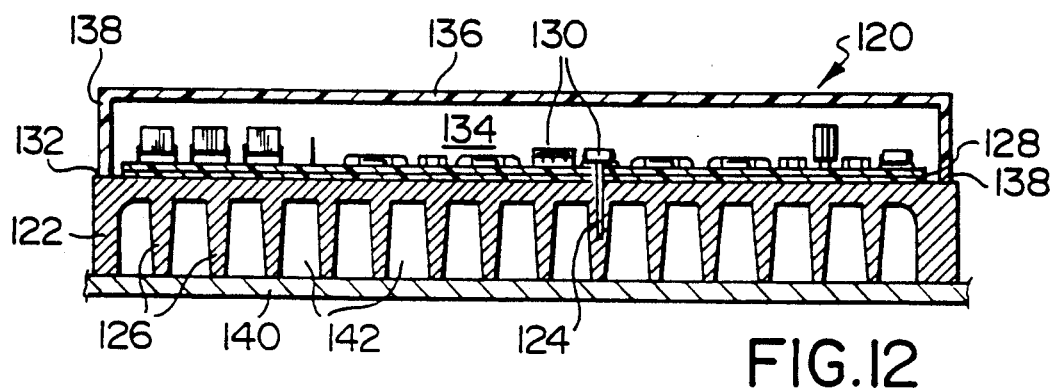
FIG. 12 is a cross-sectional view through an electronic unit of a third embodiment.

In a third embodiment as shown by the section in FIG. 12, an electronic unit 120 comprises a heat sink means in the form of a single heat sink 122 which is of similar construction to a heat sink 112 of the second embodiment and is also provided with cavities 124 in ribs 126 similar to the cavities 113 in the ribs 111 of the second embodiment. In this third embodiment, a printed circuit board means comprises a single planar board 128 having electronic components 130 extending from one surface of the board. The board is mounted upon a planar surface of a wall 132 of the heat sink 122 with the electronic components facing outwardly and into a chamber 134 which is sealingly enclosed from ambient atmosphere by a cover 136, the cover having laterally extending walls 138 which are sealed at their edges to the heat sink 122. As shown by FIG. 12 the heat sink is mounted upon a wall 140 of a frame structure so as to define with the wall 140 air flow passages 142 through which cooling air may be passed, preferably by convection, or by fan assisted means for extracting heat from the electronic components 30 through the ribs 126.

The advantages of the third embodiment and the method of operation are as described for the first embodiment.

Figure 13:
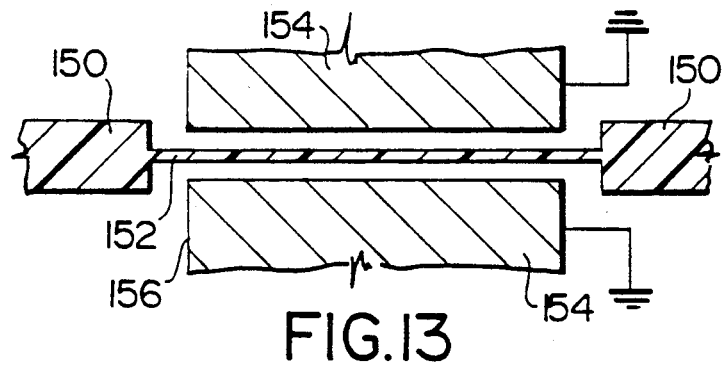
FIG. 13 is a cross-sectional view through part of an electronic unit of a fourth embodiment.

In a fourth embodiment, a capacitance effect is provided for a printed circuit board means for a different configuration of the features from that described in the first embodiment. In the fourth embodiment as shown by FIG. 13, a printed circuit board means comprises two printed circuit boards 150 which are substantially coplanar and are interconnected by an interconnecting board region 152 of much thinner section than the boards 150. The interconnecting board region 152 which may be, if required, a flexible board region, but is disposed in this embodiment in a substantially planar condition so that conductors in the board region 152 each extends along a single plane between the two printed circuit boards 150. The electrical conductors (not shown) may be disposed entirely within the interconnecting board section 152 or may be disposed at least partly upon a surface of the board region. To provide desirable capacitative and EMI filter effects for the printed circuit board means, two electrically conductive surface means are provided in suitably spaced positions one on each side of the printed circuit board region 152. These electrically conductive surface means are provided by two grounded conductive members 154 as shown in FIG. 13, the distances between the electrical conductors in the printed circuit board region 152 and opposing surfaces 156 of the members 154 being controlled to a suitable gap of for instance from 9 to 45 mil to provide the required capacitative filtering effects. In Addition, the grounded conductive members 154 on each side of and located close to the board region 152, provide EMI shielding from one board 150 to the other.

Figure 14:
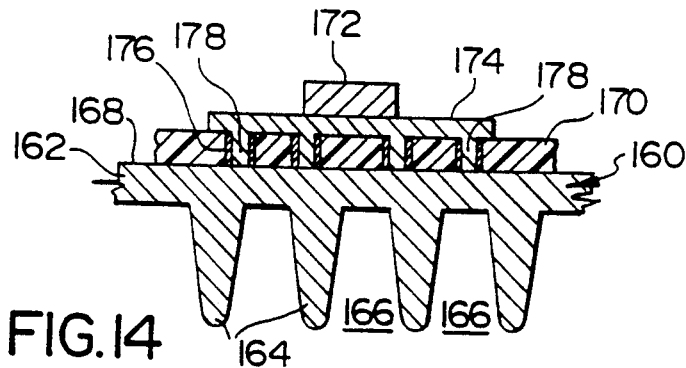
FIGS. 14 to 16 are cross-sectional views, respectively, through electronic units according to fifth, sixth and seventh embodiments.

In further embodiments now to be described, an unpackaged electronic chip is mounted in heat conductive relationship with the heat sink means such that heat passing from the chip to the heat sink means bypasses a printed circuit board means which is also incorporated in the structure. This is exemplified in a fifth embodiment and as shown by FIG. 14 in which a heat sink 160 has a wall 162 provided with a planar support surface 168 and heat exchange projection means in the form of ribs 164 extending from an opposite side of the heat sink with air flow passages 166 passing between the ribs. On the planar support surface 168 of the heat sink is disposed a planar printed circuit board 170. The printed circuit board 170 carries an unpackaged electronic chip 172 which is supported upon a planar heat conductive carrier 174. A plurality of plated through holes 176 are provided through the printed circuit board and heat conductive pegs 178 secured to the plate 174 extend through the holes and are soldered to the plating to secure the plate 174 and chip 172 in position. Free ends of the pegs terminate at the opposite side surface of the printed circuit board. The printed circuit board is assembled onto the planar surface 168 of the heat sink 160 with the free ends of the pegs 178 in heat conductive relationship with the surface 168. This heat conductive relationship may be achieved by the use of thermal grease disposed between the ends of the pegs and the surface 168.

In use of the structure of the fifth embodiment, heat generated by the chip 172 is conducted away by the plate 174 and by the pegs 178 into the heat sink 162 and is extracted from the heat sink ribs 164 by cooling air flowing along the passageways 166. Sufficient heat will be removed from the chip 172 to prevent its failure even though the circuit board and the chip may be covered by a cover means such as is described in the first embodiment. With this construction it is preferable that the thermal coefficients of expansion of the chip 172, the support plate 174 and the heat sink 162 are suitably matched to prevent damage to any of the parts or to produce any separation between them which could have a deleterious effect upon heat conduction. For instance, if the chip 172 has an expansion rate of 3 parts/million and the heat sink 162 an expansion rate of 24 parts/million then the plate 174 should have a rate of expansion between those two rates and should be compatible with them. For instance, the plate 174 may have a thermal expansion rate of from 10 or 12 parts/million.

In the sixth and seventh embodiments now to be described and in which like parts bear the same reference numerals as in the fifth embodiment, the thermal coefficients of expansion should be matched in a manner similar to that described with regard to the fifth embodiment.

Figure 15:
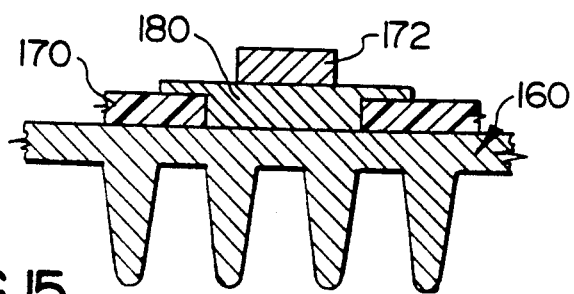

In the sixth embodiment as shown by FIG. 15, the unpackaged electronic chip 172 is bonded to an insert plug 180 which is force fitted into a large diameter hole in the printed circuit board 170. The plug 180 is in heat conductive engagement with the surface 168 of the heat sink 160 by the disposition of a thermal grease between the plug and the surface.

In use of the construction of the sixth embodiment, heat emitted from the chip 172 is passed through the plug 180 and into the heat sink 160 so as to bypass the printed circuit board 170.

Figure 16:
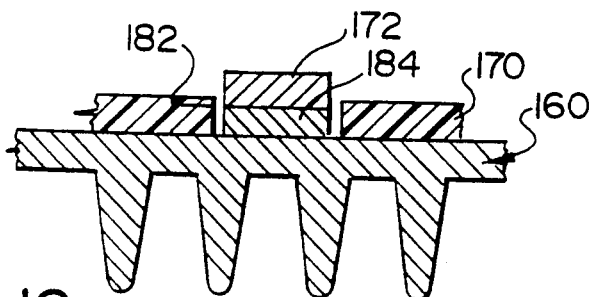
Figure 17:
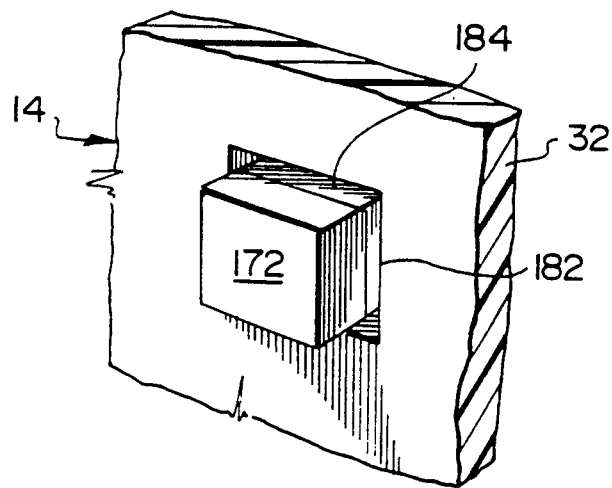
FIG. 17 is an isometric view of an electronic unit of the seventh embodiment and which is incorporated into the structure of the first embodiment.

In a seventh embodiment as shown in FIG. 16, the electronic chip 172 is not supported by the printed circuit board. In this construction, the printed circuit board 170 is formed with a window or square-shaped aperture 182 into which the chip 172 is positioned upon a planar conductive support 184, the support mounted directly upon the heat sink by a heat conductive board. The chip and the support 184 are spaced from the sides of the window 182 as shown in FIG. 17.

One or more electronic chips arranged so as to bypass heat around a printed circuit board and as described in the fifth, sixth and seventh embodiments may be incorporated in any of the electronic units described in previous embodiments. For instance, as shown by FIG. 17, the structure of the seventh embodiment is incorporated into a printed circuit board means and heater exchanger arrangement generally of the structure described in the first embodiment. As shown by FIG. 17, one or both of the regions 32 of the printed circuit board means 14 is provided with an aperture or window 182 and into which the chip is mounted upon its support 184. The chips are interspersed as necessary across the regions 32 together with the electronic components 34 so as to be covered by the half covers 50 of the cover means.

What is claimed is:

1. An electronic unit comprising a printed circuit board and a heat sink means, the printed circuit board assembled to a surface of the heat sink means which also has a heat release projection means exposed for contact by a flow of cooling fluid across the heat release projection means, the projection means including at least one rib formed with a cavity which opens on the surface of the heat sink means and terminates in a position spaced from each end of the rib, and the printed circuit board has a resistor network extending outwardly from the board and into the cavity with sides of the cavity sufficiently close to the resistor network that heat exchange occurs across the gap from the resistor network and into the rib.

* * * * *